US009682864B2

(12) United States Patent
Dhillon et al.

(10) Patent No.: US 9,682,864 B2
(45) Date of Patent: Jun. 20, 2017

(54) DISLOCATION ENGINEERING IN SINGLE CRYSTAL SYNTHETIC DIAMOND MATERIAL

(75) Inventors: Harpreet Kaur Dhillon, Ascot (GB); Nicholas Matthew Davies, Berkshire (GB); Rizwan Uddin Ahmad Khan, Berkshire (GB); Daniel James Twitchen, Ascot (GB); Philip Maurice Martineau, Berkshire (GB)

(73) Assignee: Element Six Technologies Limited, Didcot (GB)

( * ) Notice: Subject to any disclaimer, the term of this patent is extended or adjusted under 35 U.S.C. 154(b) by 533 days.

(21) Appl. No.: 13/994,852

(22) PCT Filed: Dec. 16, 2011

(86) PCT No.: PCT/EP2011/073147
§ 371 (c)(1),
(2), (4) Date: Sep. 18, 2013

(87) PCT Pub. No.: WO2012/084750
PCT Pub. Date: Jun. 28, 2012

(65) Prior Publication Data
US 2014/0004319 A1 Jan. 2, 2014

Related U.S. Application Data

(60) Provisional application No. 61/430,751, filed on Jan. 7, 2011.

(30) Foreign Application Priority Data

Dec. 24, 2010 (GB) .................................. 1021985.5

(51) Int. Cl.
*C01B 31/06* (2006.01)
*C30B 25/10* (2006.01)
*C30B 29/04* (2006.01)

(52) U.S. Cl.
CPC ............ *C01B 31/06* (2013.01); *C30B 25/105* (2013.01); *C30B 29/04* (2013.01); *Y10T 428/24802* (2015.01)

(58) Field of Classification Search
CPC ....... C01B 31/06; C30B 25/105; C30B 29/04; Y10T 428/24802
See application file for complete search history.

(56) References Cited

U.S. PATENT DOCUMENTS

2007/0212543 A1* 9/2007 Twitchen et al. ............. 428/408

FOREIGN PATENT DOCUMENTS

EP 1292726 B1 3/2003
EP 1290251 B1 11/2005
(Continued)

OTHER PUBLICATIONS

Friel et al., "Control of Surface and bulk Crystalline quality in single crystal diamond grown by chemical vapour deposition", Diamond & Related Materials, vol. 18, 2009, pp. 808-815.*
(Continued)

*Primary Examiner* — Jonathan Langman
(74) *Attorney, Agent, or Firm* — Dean W. Russell; Clark F. Weight; Kilpatrick Townsend & Stockton LLP

(57) ABSTRACT

A single crystal CVD synthetic diamond layer comprising a non-parallel dislocation array, wherein the non-parallel dislocation array comprises a plurality of dislocations forming an array of inter-crossing dislocations, as viewed in an X-ray topographic cross-sectional view or under luminescent conditions.

13 Claims, 7 Drawing Sheets

(56) References Cited

FOREIGN PATENT DOCUMENTS

| WO | 2004/027123 A1 | 4/2004 |
|----|----------------|--------|
| WO | 2007/066215 A2 | 6/2007 |

OTHER PUBLICATIONS

Lubeigt et al., An intra-cavity Raman laser using single-crystal diamond, Optics Express, vol. 18, No. 16, 2010.

Gaukroger et al., X-ray topograpy studies of dislocations in single crystal CVD diamond, Diamond and Related Materials, 17, 262-269, 2008.

Martineau et al., Identification of synthetic diamond grown using chemical vapor deposition (CVD), Gems & Gemology, 40 (1) 2, 2004.

Kiflawi et al., On the correspondence between cathodoluminescence images and X-ray diffraction contrast images of individuals dislocations in diamond, Philosophical Mag., 33(4), pp. 697-701, 1976.

Lang, A.R., The Properties of Diamond, Academic Press, London, J.E. Field Ed., pp. 425-469, 1979.

Balmer et al., Chemical vapour deposition synthetic diamond materials, technology and applications, Journal Physics Condens. Matter 21, 364221, 2009.

Araujo et al., Comparison of the crystalline quality of homoepitaxially grown CVD diamond layer on cleaved and polished substrates, Phys. Status Solidi A 207 No. 9, 2023-2028, 2010.

Martineau et al., High crystalline quality single crystal chemical vapour deposition diamond, Journal of Physics Condens. Matter 21, 364205, 2009.

Blank et al., Mechanical properties of different types of diamond, Diamond and Related Materials, pp. 1531-1535, 1999.

Sumiya, Super-hard diamond indenter prepared from high-purity synthetic diamond crystal, American Institute of Physics, 76, 026112, 2005.

Silva et al., Single crystal CVD diamond growth strategy by the use of a 3D geometrical model: growth on (113) oriented substrates, Diamond and Related Materials, 17, pp. 1067-1075, 2008.

Badzian et al., Diamond homoepitaxy by chemical vapor deposition, Diamond and Related Materials, pp. 147-157, 1993.

Burns et al., HPHT growth and x-ray characterization of high-quality type IIa diamond, Journal of Physical Condensed Matter, 21, 364224, 2009.

Martineau et al., Effect of steps on dislocations in CVD diamond grown on {001} substrates, Phys. Status Solidi C6, No. 8, 1953-1957, 2009.

International Search Report for PCT/EP2011/073147 dated Feb. 29, 2012.

Search Report for GB1021985.5 dated Mar. 30, 2011.

Search Report for GB1121721.3 dated Apr. 16, 2012.

\* cited by examiner

DISLOCATION ENGINEERING IN SINGLE CRYSTAL SYNTHETIC DIAMOND MATERIAL

FIELD OF INVENTION

The present invention relates to a method of manufacturing single crystal diamond material via a chemical vapour deposition (CVD) technique. Certain embodiments relate to a method which allows control of the number, distribution, direction and/or type of dislocations within single crystal CVD diamond material. Certain embodiments also relate to single crystal diamond materials which can be manufactured according to the methods described herein. Certain embodiments of the present invention also relate to the use of these materials in optical, mechanical, luminescent and/or electronic devices.

BACKGROUND OF THE INVENTION

Dislocations greatly and often detrimentally impact the physical and optoelectronic properties of crystalline diamond solids. For example, toughness and/or wear resistance can be affected by dislocation density and direction. Additionally, dislocations can affect the performance of optical or electronic devices based on crystalline diamond material.

Diamond is a material that is renowned for its exceptional hardness and mechanical properties and this has resulted in its use for several applications (e.g. drilling). Dislocations are known to affect these properties and in particular, in homoepitaxial CVD synthetic diamond material, dislocations normally propagate in a direction approximately parallel with the material's growth direction. The resulting parallel array of dislocations is likely to affect the mechanical properties of the material.

Parallel dislocations of significant density, such as those propagating in a <001> direction of a synthetic diamond crystal grown homoepitaxially on a (001) substrate, result in significant strain and therefore birefringence within the synthetic diamond material, which has been shown to reduce its performance for certain optical applications such as Raman lasers (see, for example, "An intra-cavity Raman laser using synthetic single-crystal diamond", Walter Lubeigt et al., Optics Express, Vol. 18, No. 16, 2010). As such, it would be desirable to lower the overall strain or at least achieve a better distribution of strain within the material to provide better optical performance. High birefringence is observed when the optical viewing axis is the same direction as the line direction for parallel dislocations, i.e. parallel to the growth direction. In optical applications, for simple engineering considerations (e.g. maximising area) it would be conventional to process the material with major faces that are perpendicular to the growth direction. This will result in dislocations which are perpendicular to the major faces of the material and parallel to the viewing axis resulting in high birefringence.

It is also believed that different dislocation types and directions will affect the performance of CVD synthetic diamond devices differently. It is postulated that the ability to select certain line directions of dislocations and not others will allow the optical and/or electronic properties of a diamond-based device to be influenced and optimised for the particular application desired.

In light of the above, one problem to be solved is to mitigate the adverse effect of certain dislocation types and/or directions in single crystal CVD synthetic diamond material, particularly in relation to optical, mechanical, luminescent, and electrical applications.

The aforementioned problem has been at least partially solved in the past by developing methods which reduce the number of dislocations in order to minimize their detrimental effect. For example, WO2004/027123 and WO2007/066215 disclose methods of forming CVD synthetic diamond material with low dislocation concentrations so as to provide high quality optical, electronic, and/or detector grade diamond material. However, it can be relatively difficult, time consuming, and costly to form CVD synthetic diamond material with a low dislocation density.

Notwithstanding other sources of dislocations, two predominant sources of dislocations include: (i) threading dislocations from the substrate to the CVD layer; and (ii) dislocations created at the interface between the substrate and the CVD layer. With reference to (i), vertically slicing a primary CVD layer to reveal a (001) face and growing a secondary layer upon this face results in threading dislocations from the primary to the secondary layer (where the Burger's vector is preserved). Given that the dislocations in the primary layer are of a <001> direction and edge or mixed 45° type, there are a number of permutations of threading dislocations within the secondary CVD layer (see Table 1). However, all of the threading dislocations are in a <100> direction and either edge or 45° mixed type. Accordingly, while this work demonstrates some degree of dislocation engineering, it is limited both in terms of dislocation line direction and type. With reference to (ii), previous studies (see, for example, M. P. Gaukroger et al., Diamond and Related Materials 17 262-269 (2008)) have shown that substrate preparation has a role in determining the dislocation type in CVD layers grown upon standard (001) substrates. Dislocations propagating from surface defects (e.g. a roughly polished substrate) are generally of a 45° mixed type, the most stable dislocation type in (001) growth.

TABLE 1

[001] growth upon a (001)-grown vertically sliced primary CVD layer, showing the various dislocation types if the threading dislocations of the secondary layer are in a [010] line direction.

| Primary layer | Line direction | Burgers vector | Variety | Secondary layer | Line direction | Variety |
|---|---|---|---|---|---|---|
| (001) | [001] | [101] | Mixed 45° | (100) | [010] | Mixed 45° |
| (001) | [001] | [011] | Mixed 45° | (100) | [010] | Edge |
| (001) | [001] | [110] | Edge | (100) | [010] | Mixed 45° |
| (001) | [001] | [1-1 0] | Edge | (100) | [010] | Mixed 45° |

In light of the above, it should be appreciated that there is a desire to find routes which minimize the impact of dislocation on specific properties such as electronic and optical properties, which may or may not be consistent with a total reduction in dislocation density. For example in some applications (e.g. those requiring mechanical toughness) a high dislocation density might in fact be preferred, but the direction and/or type of dislocations may be critical to the functional performance of the material. There is hence a need to find a route to engineer the type and/or the direction of the dislocations in homoepitaxially grown single crystal CVD synthetic diamond.

It is an aim of certain embodiments of the present invention to at least partially solve the problems outlined above.

SUMMARY OF INVENTION

According to a first aspect of the present invention there is provided a single crystal CVD synthetic diamond layer comprising a non-parallel dislocation array, wherein the non-parallel dislocation array comprises a plurality of dislocations forming an array of inter-crossing dislocations, as viewed in an X-ray topographic cross-sectional view or under luminescent conditions.

For certain applications, preferably the layer of single crystal CVD synthetic diamond has a thickness equal to or greater than 1 µm, 10 µm, 50 µm, 100 µm, 500 µm, 1 mm, 2 mm, or 3 mm. Alternatively, or additionally, the layer of single crystal CVD synthetic diamond may have a density of dislocations in a range 10 $cm^{-2}$ to $1\times10^8$ $cm^{-2}$, $1\times10^2$ $cm^{-2}$ to $1\times10^8$ $cm^{-2}$, or $1\times10^4$ $cm^{-2}$ to $1\times10^7$ $cm^{-2}$ and/or a birefringence equal to or less than $5\times10^{-4}$, $5\times10^{-5}$, $1\times10^{-5}$, $5\times10^{-6}$, or $1\times10^{-6}$. While embodiments of the invention can be provided by growth on a range of possible non-{100} oriented single crystal diamond substrates, such as {110}, {113}, and {111} oriented substrates, for certain applications the use of a {110} or {113} oriented substrate is preferred. One or more of these features are advantageous to achieve a relatively thick and/or high quality layer of single crystal CVD synthetic diamond. For example, growth on a {111} oriented substrate with a high concentration of dislocations formed in the layer of single crystal CVD synthetic diamond can result in poor quality, high strain material which cannot easily be grown to high thicknesses without fracture.

Preferably, the non-parallel dislocation array extends over a significant volume of the single crystal CVD synthetic diamond layer, the significant volume forming at least 30%, 40%, 50%, 60%, 70%, 80%, or 90% of a total volume of the single crystal CVD synthetic diamond layer. The non-parallel dislocation array may comprise a first set of dislocations propagating in a first direction through the single crystal CVD synthetic diamond layer and a second set of dislocations propagating in a second direction through the single crystal CVD synthetic diamond layer, wherein an angle between the first and second directions lies in the range 40° to 100°, 50° to 100°, or 60° to 90° as viewed in an X-ray topographic cross-sectional view or under luminescent conditions. As dislocations are known to not propagate in a perfect straight line, a direction in which a dislocation propagates may be measured in terms of an average direction over a significant length of the dislocation, where the significant length is at least 30%, 40%, 50%, 60%, 70%, 80%, or 90% of a total length of the dislocation and/or at least 50 µm, 100 µm, 250 µm, 500 µm, 1000 µm, 1500 µm, or 2000 µm.

According to certain embodiments not all dislocations in the material propagate in the aforementioned manner. However, in certain embodiments at least 30%, 40%, 50%, 70%, 80%, or 90% of a total number of visible dislocations within a significant volume of the single crystal CVD synthetic diamond layer form the non-parallel dislocation array as viewed in an X-ray topographic cross-sectional view or under luminescent conditions, the significant volume forming at least 30%, 40%, 50%, 60%, 70%, 80%, or 90% of a total volume of the single crystal CVD synthetic diamond layer.

In certain embodiments, such as {110} oriented material, the non-parallel dislocation array may be viewable in an X-ray topographic cross-sectional view but not under luminescent conditions. In certain alternative embodiments, such as {113} oriented material, the non-parallel dislocation array may be viewable under luminescent conditions but not in an X-ray topographic cross-sectional view. This is because dislocations in certain line directions emit blue luminescent light while in other line directions they do not.

In addition to the above, it has been found that material having a non-parallel dislocation array as described herein has good wear resistance coupled with increased hardness (e.g. at least 100 GPa, more preferably at least 120 GPa).

According to a further aspect of the present invention there is provided a single crystal CVD synthetic diamond object comprising a single crystal diamond layer according to any preceding claim, wherein the single crystal diamond layer forms at least 30%, 40%, 50%, 60%, 70%, 80%, or 90% of a total volume of the single crystal CVD synthetic diamond object. Such an object can be used in an optical, mechanical, luminescent, and/or electronic device or application. Alternatively, the single crystal CVD synthetic diamond object may be cut into a gemstone configuration.

According to yet another aspect of the present invention there is provided a method of forming a single crystal CVD synthetic diamond layer, the method comprising:
  providing a single crystal diamond substrate with a growth face having a density of defects equal to or less than $5\times10^3$ defects/$mm^2$ as revealed by a revealing plasma etch; and
  growing a layer of single crystal CVD synthetic diamond as previously described.

The growth face of the single crystal diamond substrate may have a {110} or {113} crystallographic orientation to form a layer of single crystal CVD synthetic diamond material having a {110} or {113} orientation for the reasons given previously. A growth rate of the layer of single crystal CVD synthetic diamond may be controlled to be sufficiently low such that a non-parallel dislocation array is formed. In this regard, it has been found that at low growth rates on a {110} oriented substrate, dislocations form a non-parallel dislocation array whereas if the growth rate is increased then a parallel network of dislocations is formed. For a {110} orientation, by growing a layer of single crystal CVD synthetic diamond on the {110} growth face at a <110> growth rate to <001> growth rate ratio below a certain limit it is possible to form a non-parallel dislocation array. It is believed that similar comments may also apply to {113} orientations although initial results indicate that a relatively high growth rate can be utilized with a {113} oriented substrate while still achieving a non-parallel dislocation array.

According to certain embodiments, the non-parallel dislocation array comprises a significant number of dislocations propagating at an acute angle of at least 20° relative to a growth direction of the layer of single crystal CVD synthetic diamond, said significant number being at least 30%, 40%, 50%, 60%, 70%, 80%, or 90% of a total number of dislocations visible in an X-ray topographic cross-sectional view or under luminescent conditions. More preferably, the dislocations propagate at an acute angle in the range 20 to 60°, 20 to 50°, or 30 to 50° relative to the growth direction of the layer of single crystal CVD synthetic diamond.

BRIEF DESCRIPTION OF THE DRAWINGS

For a better understanding of the present invention and to show how the same may be carried into effect, embodiments of the present invention will now be described by way of example only with reference to the accompanying drawings.

DETAILED DESCRIPTION OF CERTAIN EMBODIMENTS

Figure 1:
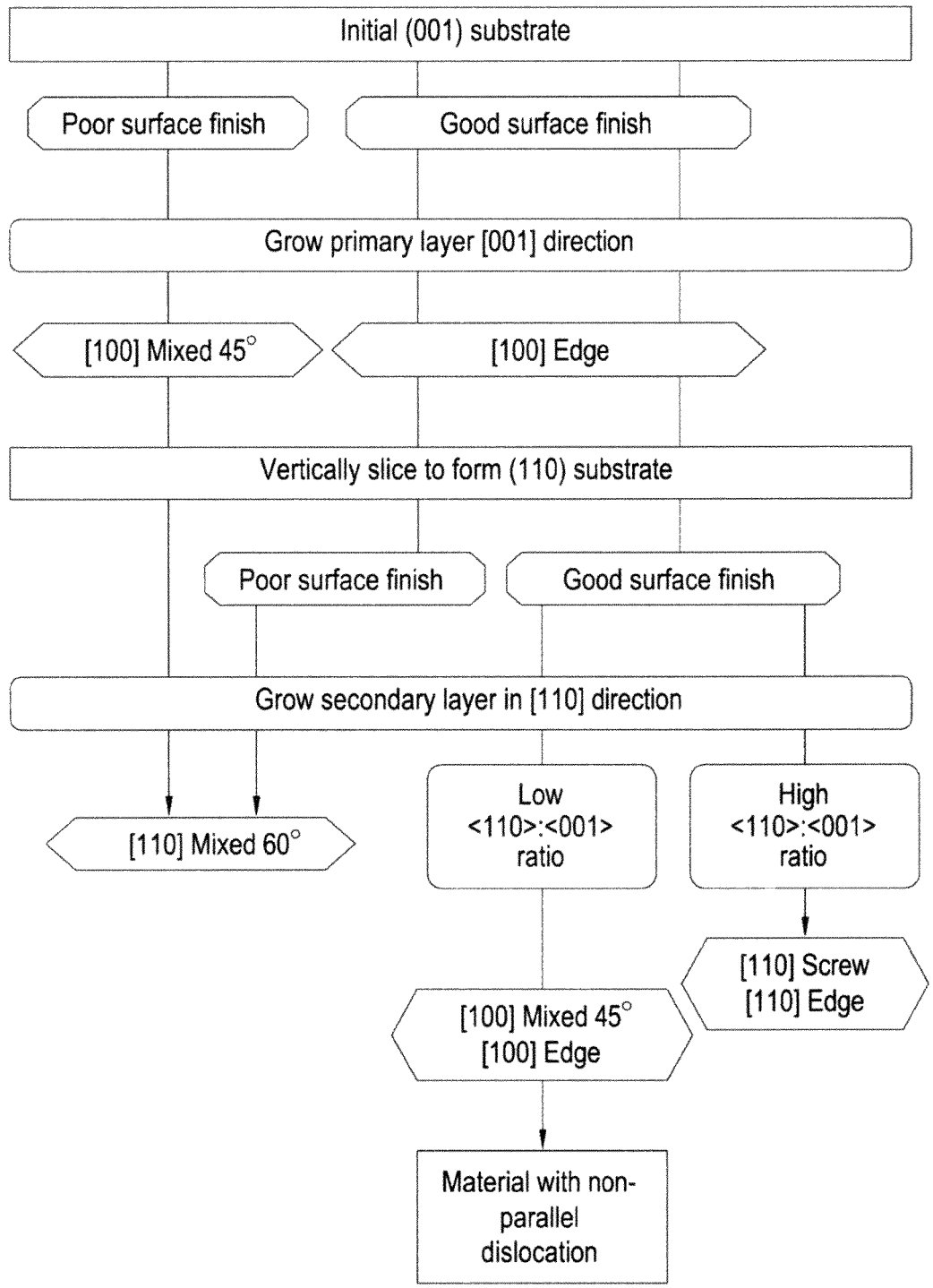
FIG. 1 illustrates a flow diagram showing how different types and orientations of dislocations can be realized in CVD synthetic diamond material, particularly highlighting a route by which a non-parallel array of dislocations within a CVD synthetic diamond material can be achieved.

According to the certain embodiments of the present invention, the present inventors have developed a technique for manufacturing single crystal CVD synthetic diamond with a non-parallel dislocation array, particularly thick high quality single crystal CVD synthetic material. This differs from previous techniques for manufacturing CVD synthetic diamond in which a parallel array of dislocations forms in the growth direction of the CVD synthetic diamond film. A parallel array of dislocations has been found to be the source of several problematic effects. For example, a parallel array of dislocations of significant density results in strain and birefringence within the material, which reduces its performance for optical applications such as Raman lasers. A parallel array of dislocations can affect the toughness and/or wear resistance of the diamond material. Furthermore, a parallel array of dislocations can also affect fluorescence and the electronic and optoelectronic properties of CVD synthetic diamond. For example, for diamond detectors, some workers have speculated that certain types of dislocations can act both as a carrier trap and also lower the breakdown voltage.

Previous work as been directed at minimizing the density of dislocations within CVD synthetic diamond materials. In contrast, the present invention has focused on providing a non-parallel array of dislocations which propagate in different directions forming a criss-crossed array of dislocations. The presence of a non-parallel dislocation array can be beneficial for certain types of optical device as it leads to a lower overall strain configuration which reduces the birefringence in a CVD synthetic diamond layer. The presence of a non-parallel dislocation array can also increase toughness and/or wear resistance of CVD synthetic diamond materials. Further still, the presence of a non-parallel dislocation array can also improve electronic performance. For example, certain types of dislocation may preferentially propagate in favour of other types which act as both a carrier trap and also lower breakdown voltage.

Certain embodiments of the invention may be applied to CVD synthetic diamond materials of different chemical types, including but not limited to nitrogen doped, phosphorus doped, boron doped, and undoped CVD synthetic diamond materials. Several experimental techniques may be used in order to indicate that a diamond material is CVD synthetic in origin. Examples include (but are not limited to): presence of emission features at 467 nm and/or 533 nm and/or 737 nm in the photoluminescence spectrum measured using 325 nm, 458 nm or 514 nm continuous-wave laser excitation at 77K, or an absorption feature at 3123 $cm^{-1}$ in the infrared absorption spectrum. A publication by P. M. Martineau et al. (Gems & Gemology, 40 (1) 2 (2004)) outlines criteria for identifying whether or not diamond material is CVD synthetic, giving examples of CVD synthetic diamond materials that were grown and/or annealed under a wide variety of conditions.

The term 'layer' refers to any grown region of CVD synthetic diamond and also refers to free-standing CVD synthetic diamond material which was originally produced via deposition of a layer onto a substrate and, optionally, the substrate subsequently removed. A single crystal CVD synthetic diamond object comprising the previously described single crystal CVD synthetic diamond layer may be provided, the single crystal diamond layer forming at least 30%, 40%, 50%, 60%, 70%, 80%, or 90% of a total volume of the single crystal CVD synthetic diamond object.

By a non-parallel dislocation array we mean that, by using techniques that are able to image dislocations in a cross-sectional view (such as X-ray topography, electron microscopy, or luminescent imaging), within a significant volume of the CVD synthetic diamond material, one observes the following: (i) dislocations of two or more line directions (i.e. not all possessing the same line direction) such that one set of dislocations propagate in a first direction through the single crystal CVD synthetic diamond layer and a second set of dislocations propagate in a second direction through the single crystal CVD synthetic diamond layer; (ii) the dislocations from the first and second set appear to intercross each other; (iii) the angle between the first and second directions lies in the range 40° to 100°, 50° to 100° or 60° to 90° in a cross-sectional view. The significant volume of the CVD synthetic diamond material is preferably at least 30%, 40%, 50%, 60%, 70%, 80%, or 90% of the total volume of the CVD synthetic diamond material. Within the significant volume preferably at least 30%, more preferably at least 50%, more preferably still at least 70%, and most preferably at least 90% of the dislocations in the CVD synthetic diamond layer propagate in the manner described above.

It may be useful to characterise the non-parallel dislocations by comparing their line directions with the CVD synthetic diamond growth direction, which can be established by investigating the orientation of certain point defects within the crystallographic lattice. For example, defects such as the nitrogen-vacancy (NV) and the nitrogen-vacancy-hydrogen (NVH) complex are aligned along <111> directions, giving 8 possible configurations (+ve line directions), and the relative populations of these configurations may show preferential orientation with respect to the growth direction. Electron paramagnetic resonance measurements varying the angular alignment of the magnetic field have been used to investigate the orientation of these defects. For example, the present inventors have observed that in growth upon a (110) surface both of these defects are aligned with the majority (equal to or greater than 50%, 60%, 80%, 95% or even 99%) orientated along the two <111> orientations out-of-plane with respect to the (110) growth surface. This preferential defect alignment is not observed for the same defects (e.g. NV) in samples grown on substantially {100} oriented substrates. As the symmetry of the relationship between the <111> directions on which these defects lie and the major growth planes for CVD diamond including the {100}, {110} and {111} is unique, then characterisation of the defect population distribution may be used to uniquely define the growth direction, and in particular whether growth has taken place on a {110} plane, and the precise {110} plane of growth in the material. The non-parallel dislocations may propagate at an acute angle in the range of 20 to 60°, or preferably 20 to 50°, or more preferably 30 to 50° relative to the growth direction (the growth direction being substantially perpendicular to the major {110} CVD growth face, which is typically but not always parallel to the substrate), the significant volume being 30%, 40%, 50%, 60%, 70%, 80%, or 90% of the total volume of the CVD synthetic diamond material.

Methods already exist to produce CVD diamond that possesses two or more different separate regions of growth defined by each region possessing parallel dislocations which propagate in a certain line direction, and dislocations in one region propagating ostensibly in a different direction to dislocations in another. One might therefore suggest that dislocations within one region are not parallel to dislocations within another. An example of two different regions is the case where a secondary CVD synthetic diamond layer is grown upon a CVD synthetic diamond substrate and the initial growth direction of the substrate and that of the secondary layer are different (see, for example, M. P. Gaukroger et al., Diam. Relat. Mater. 17, 262 (2008)). In this case the substrate and the secondary layer are two different regions. Another example of different regions is in the growth of CVD synthetic diamond on off-axis substrates, where individual dislocations vary in their line direction substantially and abruptly, by crossing different growth pseudosectors, and dislocations within one pseudosector correspond to those in one region and those in another pseudosector correspond to those in a different region. The phenomenon of different dislocation line directions in different regions of material contrasts with aspects of the present invention which are concerned with providing dislocations which are non-parallel to each other within the same region of material i.e. dislocations that intercross to form a non-parallel array, rather than dislocations in different regions of CVD synthetic diamond material that do not intercross and effectively form two separate parallel arrays in different regions of material.

X-ray topographs recorded using a Lang camera fitted to an X-ray generator can be used to identify dislocations in diamond. Section topographs recorded using a Bragg reflection of the {533} crystallographic plane allow samples to be set up in such a way that the plane sampled by the X-ray beam is within two degrees of a {001} plane. Section topographs recorded using a Bragg {008} reflection allow a {110} plane to be sampled. X-ray section and projection topography has been extensively applied to diamond by Lang and others (see, for example, I. Kiflawi et al. Phil. Mag., 33 (4) (1976) 697 and A. R. Lang, J. E. Field. Ed., "The Properties of Diamond", Academic Press, London (1979) pp. 425-469). Both section and projection X-ray topographic images may be used to measure the dislocation line directions and majority volume that the dislocations occupy. The angles between the dislocations themselves and between the growth direction and the dislocation line directions may be established by the imaging of two or more section topographs, for example, but not exclusively, by imaging the {100} and {110} planes. The majority volume can be established by either a projection topograph or two or more section topographs.

The contrast that is visible in X-ray topographs is due to the strain imparted on the crystalline lattice by a dislocation or a bundle of dislocations. Advantageously, by sampling an area between 10 nm$^2$ and 1 mm$^2$ of a single crystal CVD synthetic diamond object comprising non-parallel dislocations, it can be establish that it possesses a density of dislocations/dislocation bundles in the range 10 to 1×10$^8$ cm$^{-2}$. Within X-ray topographs it is not possible to distinguish between a dislocation or a bundle of dislocations, but strong contrast in the image would normally imply the latter. Therefore, the terms 'dislocations' and 'bundles of dislocations' are often used interchangeably. Projection topographs recorded by translating the sample through the X-ray beam can be analysed to provide information on the number of dislocations throughout a sample (see, for example, M. P. Gaukroger et al., Diamond and Related Materials 17 262-269 (2008)).

In addition to dislocation concentration, the line direction and/or Burgers vector (i.e. the dislocation type) can also play an important role. It should be noted that that the reference to the type of dislocation refers to the angle of the Burgers vector relative to the dislocation line direction. In edge dislocations, the Burgers vector and dislocation line are at right angles to one another (i.e. 90°). In screw dislocations, they are parallel (i.e. 0°). In mixed dislocations the Burgers vector is oriented at an acute angle between these extremes. Dislocation type is established through the analysis of X-ray topographs recorded for a number of different reflections (see, for example, M. P. Gaukroger et al., Diamond and Related Materials 17 262-269 (2008)). This type of analysis is applicable in characterizing single dislocations, but in the case where there may be bundles the analysis may be complicated in that the bundle may contain dislocations of more than one type. In this case, a bundle of dislocations of different type, with no single predominant type, is not characterizable into a particular dislocation type and is discounted from the analysis.

Different dislocation types possess different degrees of atomic reconstruction, and therefore impart dangling bonds to a greater or lesser degree which can contribute towards or affect the optoelectronic properties. For example, the presence/absence of blue dislocation photoluminescence present in CVD synthetic diamond material is likely to be determined both by the dislocation line direction and its Burgers vector, i.e. certain dislocation types exhibit luminescence but not others. This further emphasises the interest of the inventors in being able to select out and control dislocation types in CVD synthetic diamond material.

It will be understood that each dislocation does not tend to propagate along a perfect straight line but rather deviates therefrom due to steps formed during growth of a CVD synthetic diamond layer leading to the formation of terraces and risers. The effect of steps on dislocations in CVD synthetic diamond is described by Martineau et al. in Phys. Status Solidi C6, No. 8, 1953-1957 (2009). Accordingly, it will be understood that the direction in which a dislocation propagates is described herein in terms of an average direction over a significant length of the dislocation, where the significant length is preferably at least 30%, 40%, 50%, 60%, 70%, 80%, or 90% of the total length of the dislocation and/or equal to or greater than 50 µm, 100 µm, 250 µm, 500 µm, 1000 µm, 1500 µm, or 2000 µm in length.

The single crystal CVD synthetic diamond layer (e.g. (110) oriented) may comprise a significant number of non-parallel dislocations oriented within 20°, 10° or 5° of a <100> line direction, said significant number being at least 30%, 40%, 50%, 60%, 70%, 80%, or 90% of a total visible number of dislocations in, for example, either section or projection topographs. Optionally, less than 70%, 60%, 50%, 40%, 30%, 20% or 10% of dislocations within a significant volume of the single crystal CVD synthetic diamond layer are oriented within 20°, 10° or 5° of a <110> line direction said significant number being at least 30%, 40%, 50%, 60%, 70%, 80%, or 90% of a total visible number of dislocations in, for example, either section or projection topographs. The <100> dislocations may either be a 45° mixed or edge type. According to certain arrangements, at least 30%, 40%, 50%, 60%, 70%, 80%, or 90% of a total number of characterizable dislocations in the (110) oriented layer are of a mixed 45° type and/or an edge type. According to certain arrangements, less than 70%, 60%, 50%, 40%, 30%, 20%, 10% or 5% of characterizable dislocations within a significant volume of the single crystal CVD synthetic diamond layer are of a <110> mixed 60° type. Furthermore, according to certain arrangements, less than 70%, 60%, 50%, 40%, 30%, 20%, 10%, or 5% of characterizable dislocations within a significant volume of the single crystal CVD synthetic diamond layer may be of a <110> screw or <110> edge type.

It is important to note that the aforementioned percentages of dislocation types are relative to the total number of dislocations which are characterizable as having a particular type in a given method of analysis. For example, as previously indicated, a bundle of dislocations which contains a number of different dislocation types, with no single predominant type, will not be characterizable using a topographic method of analysis and thus will be discarded as non-characterizable. This will be understood by a person skilled in the art and is discussed in more detail below.

The Burgers vector of a dislocation can be categorised by the acquisition of a number of different projection X-ray topographs. To produce a projection topograph, it is required to translate the sample through an X-ray beam in order to expose its complete volume and to translate the film accordingly to maintain its position relative to the sample. X-ray projection topographs using different Bragg reflections are used in order to categorise the Burgers vector of a dislocation-related feature in an X-ray topograph. This method is summarised by M. P. Gaukroger et al. in Diamond and Related Materials 18 (2008) 262-269. In diamond, a <110> Burgers vector is assumed. In general, the contrast of a dislocation-related feature is dependent on the angle between its Burgers vector and the atomic layers responsible for its diffraction. To a good approximation, a dislocation-related feature is invisible in a given X-ray topograph if its Burgers vector lies parallel to the diffracting plane, has a strong contrast if its Burgers vector lies perpendicular to the diffracting plane, or has an intermediate contrast if its Burgers vector lies at an intermediate angle between 0° and 90° relative to the diffracting plane, the contrast being stronger closer to 90° and weaker when the Burgers vector is closer to 0°. This means that different dislocation types, having different Burgers vector directions, will have different contrasts in a particular topographic image. Furthermore, a single dislocation feature having a particular Burgers vector direction will show a different contrast in different topographic images taken in different directions relative to its Burgers vector.

By this method it is possible to establish the Burgers vector of a given dislocation-related feature and thus characterize its type. A dislocation feature which comprises a number of dislocations having different Burgers vectors, with no predominant direction, will tend to have an intermediate contrast in different topographic images taken in different directions and will not be characterizable.

In practice, other factors must be taken into account. Reflections should also be chosen in order to achieve suitable perspective in order to image the dislocations clearly, and to establish accurately their position between different topographs. Although the {111} reflection is a good reflection for conventional growth upon (100) substrates, it may not be the optimal reflection in other cases. For this work, it was found that it was problematic to use {111} reflections in order to achieve suitable perspective such that individual dislocation-related features would be resolved accurately. The {220} reflection was therefore chosen, as it gave a near "plan" view of the sample (about 14° off-axis) and this made it easier to recognise the same dislocation in different views. If four projection topographs employing {220} reflections are used, defining the growth direction as [110], four topographs are recorded using reflections from the (202), (022), (02-2) and (20-2) planes. If the Burgers vector lies in one of the diffracting {220} planes, then one expects dislocations to have strong contrast in one topograph, medium contrast in adjacent topographs, and be invisible in the fourth. If the dislocation-related feature is pure edge or pure screw-type, we expect medium contrast in all four topographs. One then needs to take a topograph using a reflection in the (110) growth plane in order to distinguish between the two. Using this method, dislocations of different types can be characterized. For a bundle of dislocations comprising different dislocation types, the bundle will tend to have an intermediate contrast in all topographical images and is non-characterizable. Such a dislocation feature is discarded from the analysis. For a bundle of dislocations of predominantly one type, the bundle will have a different contrast in the different topographs according to the predominant type of dislocation within the bundle and will be characterizable. Such a dislocation feature is counted as a single dislocation for the purposes of numerical analysis. In order to establish the presence or absence of a dislocation-related feature in several X-ray topographs, it is required to match the dislocation-related contrast in different images accurately. This may be performed manually by visual inspection or may be automated using a suitable computer algorithm.

Embodiments of the invention are based on the present inventor's understanding that there are two mechanisms whereby dislocations in CVD synthetic diamond can be sourced: (i) threading dislocations from a primary (substrate) layer to a secondary CVD synthetic diamond layer; and (ii) dislocations nucleated at the interface between substrate surface and the CVD synthetic diamond layer either due to surface defects or other reasons (e.g. lattice mismatch). What has led to certain embodiments of the present invention is the acknowledgement that growth upon (110) surfaces leads to vastly greater dislocation engineering scenarios for both (i) and (ii).

With reference to item (i), certain embodiments of the invention are based on research performed by the inventors in investigating growth upon (110) surfaces, by vertically slicing a primary (001) CVD layer to form a (110) growth face and growing upon this face. The inventors have recognized that there are geometrical arguments which can result in one type of dislocation in the primary (001)-grown layer threading through and being converted into a second type of dislocation in the secondary (110)-grown layer, by changing the line direction but maintaining the Burger's vector, as illustrated in Table 2. From this table, we observe that it is possible to create a secondary CVD layer that only contains specific dislocation types and/or line directions. For example, it is possible to create a CVD layer that contains 60° mixed <110> dislocations, if the primary (001)-grown layer contains 45° mixed dislocations. Conversely, it is possible to create a secondary (110)-grown layer that contains 45° mixed <100> dislocations, if the primary (001)-grown layer contains edge dislocations. As such, it has been demonstrated that it is possible to engineer specific dislocation line directions and types in a secondary CVD layer which are determined by the dislocation type in the primary layer. This possibility to grow-in some types/line directions of threading dislocations and not others allows the possibility of separating out and studying different types of dislocations (edge, screw or mixed). This leads to a far greater scope in terms of dislocation engineering than standard growth on (001) substrates.

TABLE 2

(110) growth upon a (001)-grown vertically sliced primary CVD layer, showing the various threading dislocation types if the dislocations are in a [110] and [010] line direction, respectively.

| Primary layer | Line direction | Burgers vector | Variety | Secondary layer | Line direction | Variety |
|---|---|---|---|---|---|---|
| (001) | [001] | [101] | Mixed 45° | (110) | [110] | Mixed 60° |
| (001) | [001] | [011] | Mixed 45° | (110) | [110] | Mixed 60° |
| (001) | [001] | [110] | Edge | (110) | [110] | Screw |
| (001) | [001] | [110] | Edge | (110) | [110] | Edge |
| (001) | [001] | [101] | Mixed 45° | (110) | [010] | Edge |
| (001) | [001] | [011] | Mixed 45° | (110) | [010] | Mixed 45° |
| (001) | [001] | [110] | Edge | (110) | [010] | Mixed 45° |
| (001) | [001] | [1 −1 0] | Edge | (110) | [010] | Mixed 45° |

With relevance to item (ii) mentioned above, the present inventors have observed that growing on a (110) surface gives even more scope for dislocation engineering for those dislocations that form at the CVD/substrate interface. The present inventors have observed that when a good (110) substrate finish is employed for (110) growth, under specific growth conditions which are discussed later, a non-parallel array of dislocations possessing a <100> direction can be created, some of which are nucleated at the interface between the (110) substrate and the secondary layer. However, if poor substrate surface finish is employed, irrespective of the growth conditions, a parallel array of dislocations possessing a <110> direction is observed. Poor substrate surface finish leads to microscale cracks on the substrate surface that act as sources of dislocations, and the inventors have observed that these dislocations nucleated at surface defects are of a specific type that grow in a parallel <110> configuration. Therefore it is essential to process the substrate surface carefully to avoid the nucleation of these parallel dislocations.

Certain methods of forming a single crystal CVD synthetic diamond layer comprise: providing a single crystal diamond substrate with a (110) growth face having a density of defects equal to or less than $5 \times 10^2$ defects/mm$^2$ as revealed by a revealing plasma etch; and growing a layer of single crystal CVD synthetic diamond on the (110) growth face at a <110> growth rate to <001> growth rate ratio below a limit whereby a non-parallel dislocation array forms in the layer of single crystal CVD synthetic diamond. The (110) growth face may be formed from single crystal CVD synthetic diamond, a single crystal natural diamond, or single crystal HPHT (high pressure, high temperature) synthetic diamond. For example, a single crystal CVD synthetic diamond plate, a single crystal natural diamond, or a single crystal HPHT synthetic diamond plate may be processed to form the (110) growth face having a density of defects equal to or less than $5 \times 10^2$ defects/mm$^2$ as revealed by a revealing plasma etch. Processing may, for example, involve slicing and polishing and/or plasma etching.

According to certain embodiments a multi-stage growth process may be used. For example, certain methods comprise:
providing a single crystal diamond substrate comprising a (001) growth surface have a density of defects equal to or less than $5 \times 10^3$ defects/mm$^2$ as revealed by a revealing plasma etch;
growing a first layer of single crystal CVD synthetic diamond on the (001) growth surface;
vertically slicing the first layer of single crystal CVD synthetic diamond to form the (110) growth face;
treating the (110) growth face such that it possesses a density of defects less than $5 \times 10^2$ defects/mm$^2$ as revealed by a revealing plasma etch; and
growing a second layer of single crystal CVD synthetic diamond on the (110) growth face at a <110> growth rate to <001> growth rate ratio below a limit whereby a non-parallel dislocation array forms in the second layer of single crystal CVD synthetic diamond.

FIG. 1 illustrates a flow diagram showing how the different types and orientations of dislocations can be realized in a CVD synthetic diamond material, particularly highlighting a route by which a non-parallel array of dislocations within a CVD synthetic diamond material can be achieved. In FIG. 1, the primary layer refers to a (001) single crystal CVD synthetic diamond layer grown on a (001) single crystal diamond substrate. The primary layer is then sliced vertically along a diagonal to form a (110) single crystal diamond substrate on which the secondary layer of (110) single crystal CVD synthetic diamond is grown.

It should be noted that when we talk about a (001) single crystal diamond substrate we mean a substrate oriented to have a (001) crystallographic plane at the growth surface. However, the growth surface may not be perfectly aligned with a (001) oriented plane. Due to processing constraints, the actual growth surface orientation can differ from this ideal orientation up to 5°, and in some cases up to 10°, although this is less desirable as it adversely affects reproducibility. Similar comments also apply for the (110) single crystal diamond substrate.

FIG. 1 highlights that the dislocation types found in the primary layer are dependent on the quality of the (001) substrate growth surface on which the primary layer is grown. If the (001) substrate growth surface has a poor surface finish, mixed 45° dislocations are formed in the <001> direction (i.e. a parallel array of mixed 45° dislocations aligned vertically in the growth direction). If the (001) substrate growth surface has a good surface finish, edge dislocations are the predominant type formed in the <001> direction (i.e. a parallel array aligned vertically in the growth direction).

FIG. 1 also illustrates that the type and orientation of dislocations found in the secondary layer can be dependent on: (i) the type of dislocations in the primary layer, (ii) the surface finish of the (110) substrate produced from the primary layer, and (iii) the growth rate used for the secondary layer.

If a poor substrate growth surface finish is initially provided for growth of the primary layer, resulting in a parallel array of <100> mixed 45° dislocations, and then the primary layer is sliced vertically along a diagonal to form a (110) single crystal diamond substrate on which the secondary layer is grown, a parallel array of <110> oriented dislocations of a mixed 60° type is formed. This is an undesirable route.

In contrast, if a good substrate growth surface finish is initially provided for growth of the primary layer, resulting in a parallel array of <100> edge dislocations, and then the primary layer is then sliced vertically along a diagonal to form a (110) single crystal diamond substrate on which the secondary layer is grown, the present inventors have found that a number of possibilities are available, as shown in FIG. 1. If the (110) single crystal diamond substrate (upon which the secondary layer is grown) possesses a poor substrate finish, surface defects will again result in the creation of parallel <110> oriented dislocations of a mixed 60° type. If the (110) single crystal diamond substrate is well-prepared, surprisingly there are two possibilities which are dependent on the growth rate of the secondary layer. If a relatively high <110> growth rate to <001> growth rate ratio is used for the secondary layer, a parallel array of <110> oriented screw and/or edge type dislocations is formed. Alternatively, if a relatively low <110> growth rate to <001> growth rate ratio is used for the secondary layer, a non-parallel array of <100> oriented mixed 45° and/or edge type dislocations is formed.

It can be important to avoid surface defects on the (110) substrates, as these result in the nucleation of new dislocations in the secondary layer that adopt a low core-energy configuration i.e. <110> mixed 60° (analogous to the <100> mixed 45° dislocations formed in growth upon poorly-prepared standard (001) substrates). Avoidance of the nucleation of <110> mixed 60° dislocations in the secondary layer entails growth upon well-prepared (110) substrates e.g. by scaif polishing and by utilisation of a pre-etch prior to growth that avoids the generation of macroscopic pits.

Even when the (110) substrate for the secondary layer is perfectly prepared and there are negligible surface defects, there are still some non-threading dislocations that are sourced at the interface between the (110) substrate and the secondary CVD synthetic diamond layer. Without wanting to be bounded by theory, having excluded the aforementioned mechanisms of dislocation nucleation, it is considered that these dislocations may be due to lattice parameter mismatch between the primary and the secondary layer. It has been observed that even though these dislocations are sourced at the interface in a similar manner to those that arise from poor substrate preparation, these dislocations adopt a non-parallel array of <100> oriented mixed 45° or edge type configuration, unlike those that arise from poor substrate preparation. Accordingly, these dislocations are not required to be removed in order to achieve embodiments of the present invention.

In light of the above, it is evident that to achieve a non-parallel array of dislocations in single crystal CVD synthetic diamond according to certain embodiments of the present invention requires: (i) careful preparation of the initial (001) substrate prior to growth of the primary (001) diamond layer; (ii) careful preparation of the (110) substrate formed from the primary layer; and (iii) careful control of the growth rate of the secondary (110) diamond layer.

Without wanting to be bounded by theory, the previously described results may be justified as follows.

CVD single crystal diamond growth is usually governed by kinetic rather than thermodynamic processes. However, the balance between kinetic and thermodynamically driven process can be changed via a change in growth parameters. For example, by growing at a low <110> growth rate to <001> growth rate ratio, the growth is more likely to be dominated by thermodynamic rather than kinetic factors and vice versa for high <110> growth rate to <001> growth rate ratios.

In relation to the above, the present inventors have found a "low" ratio of <110> growth rate to <001> growth rate may be one below 1.0 and a "high" ratio may be greater than 1.0. The <110> growth rate to <001> growth rate ratio may be controlled to be equal to or less than 1.0, 0.8, 0.6, 0.4, or 0.2. However, those skilled in the art will recognize that different conditions, such as a different diamond growth surface temperature, will impact the detailed kinetics/thermodynamics and might substantially alter this definition of "low" and "high". The <110> growth rate to <001> growth rate ratio is strongly influenced by the <110> growth rate.

Modifying the <110>:<001> growth rate ratio in the manner thus far discussed is achievable for a person skilled in the art. Previously published studies discuss the modification of growth parameters such as nitrogen doping, boron doping, and substrate temperature and their relative effect on the growth rate in different crystallographic directions. Such growth rate ratios are usually characterised in terms of $\alpha$, $\beta$ and $\gamma$ parameters. However, for the purposes of the present invention this is an overcomplicated scheme and we need refer simply to the growth rate ratio of <110>:<100>.

Growing the secondary layer of (110) CVD synthetic diamond at a sufficiently low <110>:<100> growth rate ratio allows dislocations to adopt a configuration that minimises their overall energy per unit length. That is, lower core energy per unit length (more thermodynamically favourable) dislocations are grown-in. We expect <110> mixed 60° dislocations to possess the lowest energy per unit length. Therefore, under low <110>:<100> growth rate ratios, these <110> mixed 60° dislocations will still be grown-in, if there is the possibility to create them either by the threading of <100> mixed 45° dislocations in the primary layer to the secondary layer, or by poor surface preparation of the (110) substrate produced from the primary layer. Hence, it is desirable to remove all sources of <110> mixed 60° dislocations. As already mentioned, this is done by both correct preparation of the substrate upon which the primary layer is grown upon in order to minimise <100> mixed 45° dislocations in the primary layer, and also by good surface preparation of the (110) substrate produced from the primary layer.

In the absence of <110> mixed 60° dislocations being created, a non-parallel array of <100> oriented edge and mixed 45° dislocations is grown in. The <100> oriented edge and mixed 45° dislocations propagate at an acute angle of approximately 45° from the growth direction and result in a non-parallel dislocation array. This has been achieved via a combination of correct primary and secondary substrate processing and secondary layer growth parameters.

At higher <110>:<100> growth rate ratios, the kinetics of the growth process will dominate over the thermodynamics.

When the growth processes are dominated by kinetics rather than by thermodynamics, the dislocations will simply revert to the shortest length configuration which means that they will follow the growth direction, i.e. the <110> direction in this case for the secondary layer. Therefore, at high growth rates, higher core energy dislocations will be preferentially grown-in. These include <110> screw and <110> edge dislocations as illustrated in FIG. 1.

More detail regarding how to prepare growth surfaces and how to control growth rates to achieve the present invention are given later in this specification. It should be noted that the specific growth rate ratio required to achieve a non-parallel array of dislocations will depend on the growth chemistry used in the CVD process and will vary somewhat according to the specific growth chemistries used. However, it will be understood that a person skilled in the art will be able to optimize the growth rate ratios by performing a series of trial runs at different growth rate ratios for a particular process set-up in order to find a growth rate ratio which is near, but does not exceed, the thermodynamic limit at which dislocations switch from the more thermodynamically stable <100> orientation to the kinetically driven <110> orientation in the secondary growth stage based on a (110) substrate which contains <100> oriented edge type dislocations. Those skilled in the art are aware of factors that alter growth rate ratios. These include, for example, diamond growth temperature, carbon fraction in the gas phase, and the presence of certain impurities such as nitrogen and boron.

Figure 2:
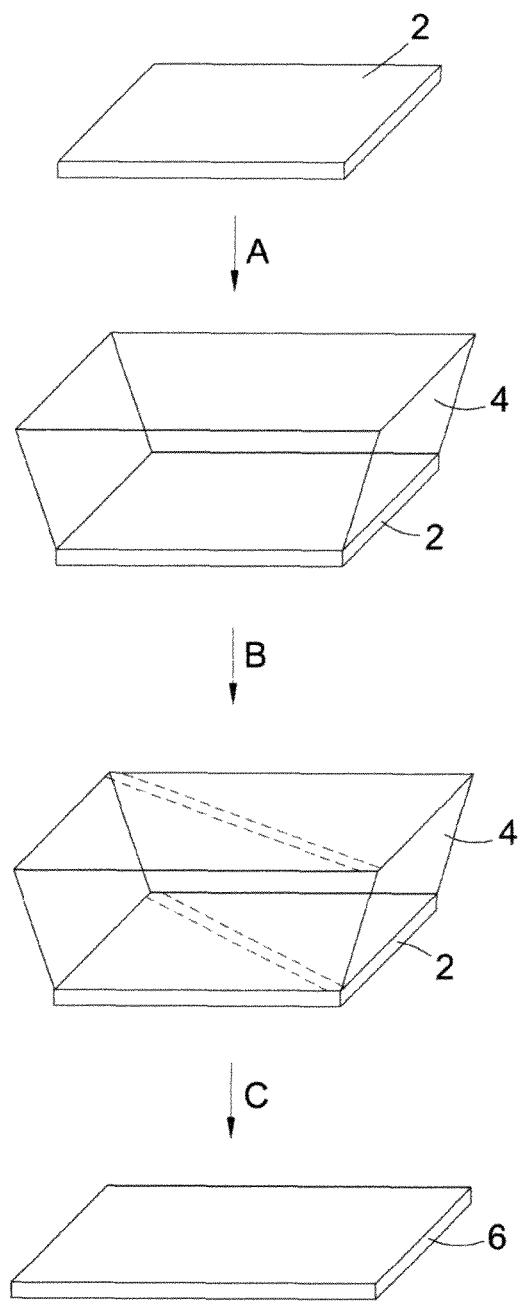
FIG. 2 illustrates the method steps involved in forming a CVD synthetic diamond material having a non-parallel dislocation array in accordance with an embodiment of the present invention and possible alternative synthesis routes which result in a parallel array of dislocations.
Figure 2:
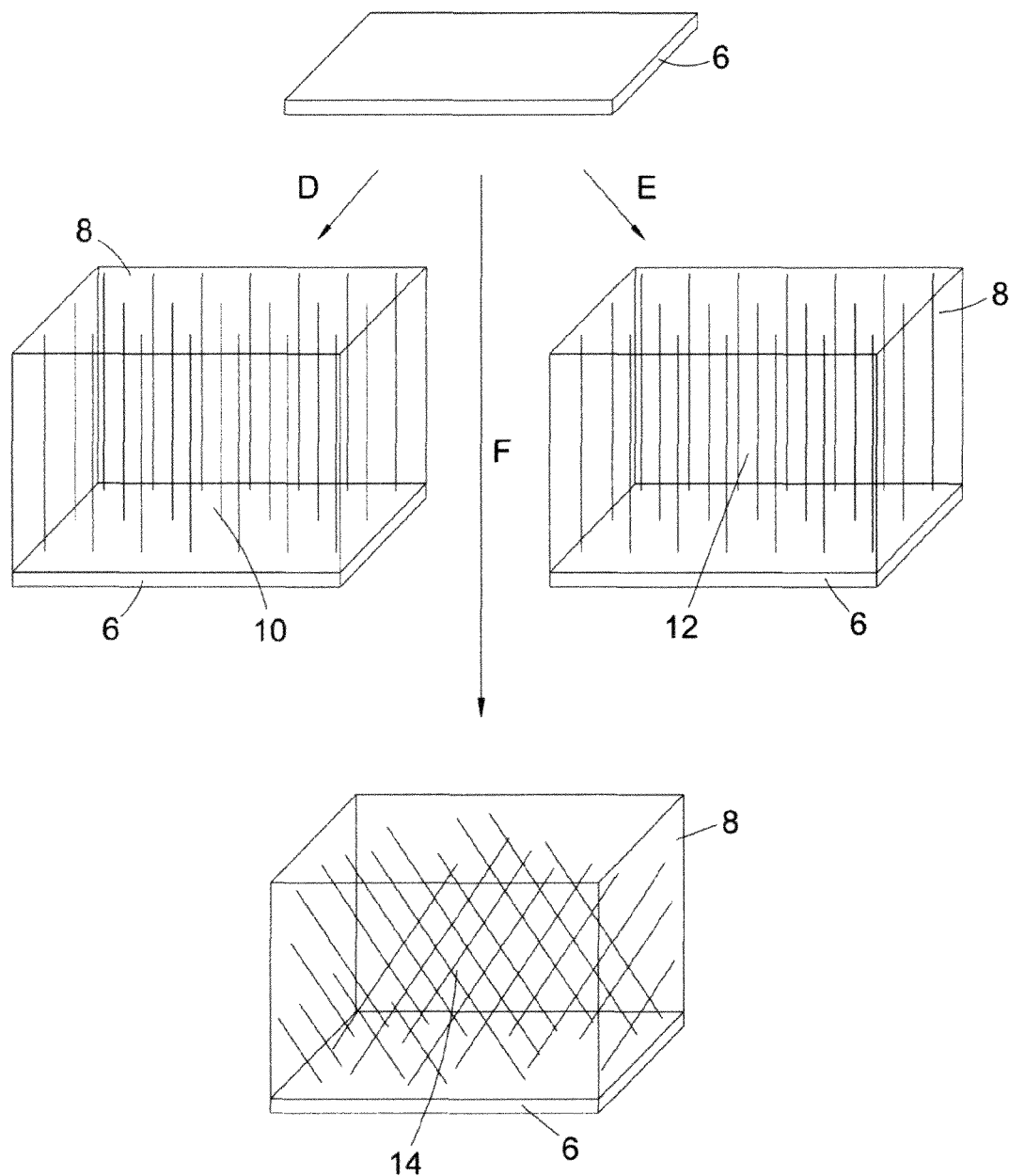

FIG. 2 illustrates the method steps involved in forming a CVD synthetic diamond material having a non-parallel dislocation array in accordance with an embodiment of the present invention and possible alternative synthesis routes which result in a parallel array of dislocations. Initially, a (001) single crystal diamond substrate 2 is provided. This may be formed of a natural, HPHT, or CVD synthetic diamond material. Although each of these different types of diamond material have their own distinct features and are thus identifiable as distinct, the key feature for this substrate is that the growth surface is carefully prepared to have a good surface finish.

By good surface finish, we mean a surface having a density of defects equal to or less than $5 \times 10^2$ defects/mm$^2$ as revealed by a revealing plasma etch. The defect density is most easily characterised by optical evaluation after using a plasma or chemical etch optimised to reveal the defects (referred to as a revealing plasma etch), using for example a brief plasma etch of the type described below.

Two types of defects can be revealed:
1) Those intrinsic to the substrate material quality. In selected natural diamond the density of these defects can be as low as 50/mm$^2$ with more typical values being 10$^2$/mm$^2$, whilst in others it can be 10$^6$/mm$^2$ or greater.
2) Those resulting from polishing, including dislocation structures and microcracks forming chatter tracks along polishing lines. The density of these can vary considerably over a sample, with typical values ranging from about 10$^2$/mm$^2$, up to more than 10$^4$/mm$^2$ in poorly polished regions or samples.

The preferred low density of defects is such that the density of surface etch features related to defects is below $5 \times 10^3$/mm$^2$, and more preferably below 10$^2$/mm$^2$. It should be noted that merely polishing a surface to have low surface roughness does not necessarily meet these criteria as a revealing plasma etch exposes defects at and just underneath the surface. Furthermore, a revealing plasma etch can reveal intrinsic defects such as dislocations in addition to surface defects such as microcracks and surface features which can be removed by simple polishing.

The defect level at and below the substrate surface on which the CVD growth takes place may thus be minimised by careful selection and preparation of the substrate. Included here under "preparation" is any process applied to the material from mine recovery (in the case of natural diamond) or synthesis (in the case of synthetic material), as each stage can influence the defect density within the material at the plane which will ultimately form the substrate surface when preparation as a substrate is complete. Particular processing steps may include conventional diamond processes such as mechanical sawing, lapping and polishing (in this application specifically optimised for low defect levels), and less conventional techniques such as laser processing, reactive ion etching, ion beam milling or ion implantation and lift-off techniques, chemical/mechanical polishing, and both liquid chemical processing and plasma processing techniques. In addition, the surface $R_Q$ measured by stylus profilometer, preferably measured over a 0.08 mm length, should be minimised, typical values prior to any plasma etch being no more than a few nanometers, i.e. less than 10 nanometers. $R_Q$ is the root mean square deviation of surface profile from flat (for a Gaussian distribution of surface heights, $R_Q$=1.25 Ra. For definitions, see for example "Tribology: Friction and Wear of Engineering Materials", 1M Hutchings, (1992), Publ. Edward Arnold, ISBN 0-340-56184).

One specific method of minimising the surface damage of the substrate is to include an in situ plasma etch on the surface on which the homoepitaxial diamond growth is to occur. In principle this etch need not be in situ, nor immediately prior to the growth process, but the greatest benefit is achieved if it is in situ, because it avoids any risk of further physical damage or chemical contamination. An in situ etch is also generally most convenient when the growth process is also plasma based. The plasma etch can use similar conditions to the deposition or diamond growing process, but with the absence of any carbon containing source gas and generally at a slightly lower temperature to give better control of the etch rate. For example, it can consist of one or more of the following:
(i) An oxygen etch using predominantly hydrogen with optionally a small amount of Ar and a required small amount of $O_2$. Typical oxygen etch conditions are pressures of 50-450×10$^2$ Pa, an etching gas containing an oxygen content of 1 to 4 percent, an argon content of 0 to 30 percent and the balance hydrogen, all percentages being by volume, with a substrate temperature 600-1100° C. (more typically 800° C.) and a typical duration of 3-60 minutes.
(ii) A hydrogen etch which is similar to (i) but where the oxygen is absent.
(iii) Alternative methods for the etch not solely based on argon, hydrogen and oxygen may be used, for example, those utilising halogens, other inert gases or nitrogen.

Typically the etch consists of an oxygen etch followed by a hydrogen etch and then moving directly into synthesis by the introduction of the carbon source gas. The etch time/temperature is selected to enable remaining surface damage from processing to be removed, and for any surface contaminants to be removed, but without forming a highly roughened surface and without etching extensively along extended defects such as dislocations which intersect the surface and thus cause deep pits. As the etch is aggressive, it is particularly important for this stage that the chamber design and material selection for its components be such that no material is transferred by the plasma from the chamber into the gas phase or to the substrate surface. The hydrogen etch following the oxygen etch is less specific to crystal defects rounding off the angularities caused by the oxygen etch which aggressively attacks such defects and providing a smoother, better surface for subsequent growth.

Having suitably prepared the growth surface of the (001) single crystal diamond substrate 2 as illustrated in FIG. 2, Step A involves CVD growth of a primary layer of (001) oriented single crystal CVD synthetic diamond material 4 on the substrate 2. This layer will comprise <100> oriented edge type dislocations as previously discussed in relation to FIG. 1.

In Step B, the primary layer of (001) oriented single crystal CVD synthetic diamond material 4 is vertically sliced along a diagonal (indicated by the dotted lines in FIG. 2) to yield a (110) single crystal diamond plate 6 as illustrated in Step C. This may be achieved using a laser. The (110) single crystal diamond plate 6 may then be used as a substrate on which the secondary layer of single crystal CVD synthetic diamond material 8 is grown. Subsequently, the secondary layer of single crystal CVD synthetic diamond material can be grown on the growth surface of the (110) substrate.

The growth surface of the (110) substrate 6 must be treated in a similar manner as described in relation to the (001) substrate to obtain a good surface finish. By good surface finish, again we mean a surface having a density of defects equal to or less than $5 \times 10^3$ defects/mm$^2$ and more preferably below $10^2$/mm$^2$ as revealed by a revealing plasma etch. However, over-etching the substrate will lead to pits being formed on the substrate surface. Typically these pits consist of (001) and (111) crystallographic planes and if they are of a depth greater than 5 μm they will result in the nucleation of new dislocations in the (110) layer which will adopt a low energy (i.e. <110> mixed 60°) configuration. This will also manifest itself in pits on the final growth surface. The conditions whereby over-etching occur will vary strongly according to reactor geometry but will occur when etching for an excessive duration (several hours) or at excessive powers and/or temperatures.

The various possibilities for dislocation types and orientations are illustrated in Steps D, E and F of FIG. 2. According to Step D, if the initial (001) diamond substrate was not well prepared, resulting in <100> mixed 45° dislocations in the primary layer, then a parallel array of <110> oriented mixed 60° dislocations 10 is formed in the secondary layer. Also according to Step D, if the (110) diamond substrate was not well prepared, then a parallel array of <110> oriented mixed 60° dislocations 10 may be nucleated in the secondary layer. According to Step E, if the initial (001) diamond substrate was well prepared, resulting in <100> edge dislocations in the primary layer, but a high <110> growth rate to <001> growth rate ratio is used for forming the secondary layer 8, then a parallel array of <110> oriented screw and edge dislocations 12 is formed in the secondary layer. In contrast, according to Step F, if the initial (001) diamond substrate was well prepared, resulting in <100> edge dislocations in the primary layer, and a relatively low <110> growth rate to <001> growth rate ratio is used for forming the secondary layer 8, then a non-parallel array of <100> oriented mixed 45° and edge dislocations 14 is formed in the secondary layer.

Growth on a (110) surface as described herein offers a route to a greater variety of dislocation types in the secondary layer than growth on (001) surfaces. The possible orientations and types of dislocation in the secondary (110) layer are summarized below.

| Dislocation type (assuming <110> Burger's Vector) | |
| --- | --- |
| [100] | Edge |
| [100] | Mixed 45° |
| [110] | Mixed 60° (most favourable in terms of core energy) |
| [110] | Edge |
| [110] | Mixed 45° |
| [110] | Screw (least favourable in terms of core energy) |

Figure 3:
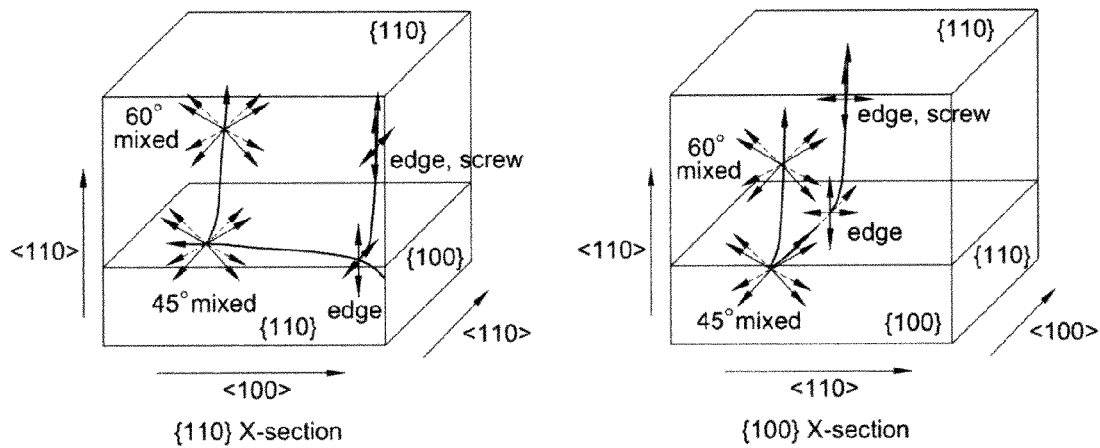
FIG. 3 illustrates dislocation types which propagate in a direction parallel to the growth direction in a (110)-grown CVD synthetic diamond layer.
Figure 4:
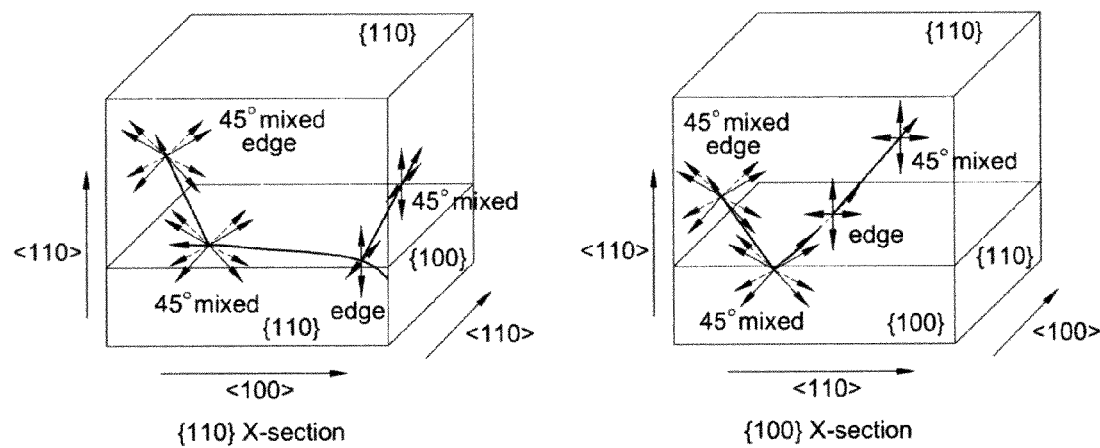
FIG. 4 illustrates dislocation types which propagate at an acute angle relative to the growth direction in a (110)-grown CVD synthetic diamond layer.

These different types and orientations of dislocation in the secondary layer are also illustrated in FIGS. 3 and 4. FIG. 3 illustrates dislocation types which can propagate in a direction parallel to the growth direction in a (110) CVD synthetic diamond layer. The growth direction corresponds to the <110> direction which is the vertical direction in the Figures. The dislocations propagate from edge or 45° mixed dislocations in the primary CVD layer (the lower layer in each of the figures). FIG. 4 illustrates dislocation types which propagate at an acute angle relative to the growth direction in a (110) CVD synthetic diamond layer. The dislocations propagate in the <100> direction at an angle of approximately 45° to the vertical growth direction. Again, the dislocations propagate from edge or 45° mixed dislocations in the primary CVD layer. As such, FIG. 3 illustrates the dislocations which form in accordance with Steps D and E as previously described in relation to FIG. 2 whereas FIG. 4 illustrates the dislocations which form in accordance with Step F as previously described in relation to FIG. 2.

Energetically, the most favourable dislocations (lowest core energy) in the secondary layer are <110> mixed 60° dislocations. <110> mixed 60° dislocations in the secondary layer are a result of <100> mixed 45° dislocations in the primary layer or by poor surface preparation of the (110) substrates formed from the primary layer. More generally, mixed dislocation types tend to be of a lower energy than edge or screw dislocations. <100> mixed 45° dislocations in the primary layer result from growth on poorly prepared substrates. Growing the primary layer on a well prepared (001) substrate surface with a good finish will lead to very few <100> mixed 45° dislocations in the primary layer, and will therefore help to minimise the number of <110> mixed 60° dislocations in the secondary layer. Dislocations are also created at the interface between the secondary layer and the (110) substrate produced from the primary layer. If the surface preparation of the (110) substrate is good, the dislocations that are created at the interface will only be of the <100> edge or mixed 45° type. If the surface preparation of the (110) substrate is poor, <110> mixed 60° dislocations will additionally be created. Minimising the number of <110> mixed 60° dislocations in the secondary layer created at the interface can therefore be achieved by processing the (110) substrate to a high standard. If both of these steps are performed in order to eliminate <110> mixed 60° dislocations, <110> or <100> edge, <100> mixed 45°, or <110> screw dislocations will be grown-in and selected through adjustment of growth process parameters.

In light of the above, it is apparent that embodiments of the present invention allow: (i) control of the primary layer to remove <100> mixed 45° dislocations so as to remove <110> mixed 60° dislocations in the secondary layer; and (ii) control of the surface preparation of the (110) substrate produced from the primary layer in order to avoid the creation of <110> mixed 60° dislocations at the interface between the substrate and secondary layer. The growth rate may then be controlled in the secondary layer such that the resultant single crystal CVD synthetic diamond material has a non-parallel dislocation array comprising <100> mixed 45° and/or <100> edge dislocations.

In addition to controlling the orientation and type of dislocations which can be provided in single crystal CVD synthetic diamond material, by using substrate surface treatments and controlling CVD growth parameters, it is also possible to control the density of the dislocations formed in the material. Generally, a lower concentration of defects at the growth surface of a substrate leads to a low density of defects in CVD synthetic diamond material grown on the substrate. Furthermore, careful control of the CVD chemistry and process parameters such as pressure, substrate temperature, flow rate of reactants, and plasma temperature can reduce the density of defects grown into CVD synthetic diamond material. For example, the primary layer of (001) single crystal CVD synthetic diamond may comprise a density of dislocations in the range 10 $cm^{-2}$ to $1 \times 10^8$ $cm^{-2}$. Furthermore, the secondary layer of (110) single crystal CVD synthetic diamond may comprise a density of dislocations in the range 10 $cm^{-2}$ to $1 \times 10^8$ $cm^{-2}$.

Embodiments of the present invention also allow the possibility of separating out and investigating single types of dislocations (e.g. <110>60° mixed dislocations or <100>45° mixed dislocations), assessing their fundamental properties, and studying which types of dislocation cause greater or lesser detriment in terms of device performance. As such, embodiments of the present invention open up the possibility of providing single crystal CVD synthetic diamond products in which the concentration, distribution, orientation, and type of dislocations are chosen and controlled to minimize their impact on material properties or even improve material properties. These material properties include optical birefringence, electronic (breakdown and μ), luminescence, and mechanical (wear and toughness).

Embodiments of the present invention can provide a single crystal CVD synthetic diamond product comprising a significant volume having a dislocation density in the range 10 $cm^{-2}$ to $1 \times 10^8$ $cm^{-2}$, $1 \times 10^2$ $cm^{-2}$ to $1 \times 10^8$ $cm^{-2}$, or $1 \times 10^4$ $cm^{-2}$ to $1 \times 10^7$ $cm^{-2}$. Alternatively or additionally the single crystal CVD synthetic diamond product can have a birefringence equal to or less than $5 \times 10^{-4}$, $5 \times 10^{-5}$, $1 \times 10^{-6}$, $5 \times 10^{-6}$, or $1 \times 10^{-6}$. The material may also have single substitutional atomic nitrogen in a concentration range 0.001 to 20 ppm, preferably 0.01 to 0.2 ppm.

While the previous discussion has largely been directed to {110} oriented growth, the present inventors have also found that similar comments apply having regard to CVD growth on {113} oriented substrates. In fact, initial results indicate that there may be some advantages to performing the invention on {113} oriented substrates as growth rates can be pushed up whilst still retaining a non-parallel dislocation array. It has been found that thick, high quality single crystal CVD synthetic diamond material comprising a non-parallel dislocation array can be fabricated having a {113} crystallographic orientation. One significant difference between the {110} orientation and the {113} orientation is that for certain {110} embodiments the non-parallel dislocation array is visible in an X-ray topographic cross-sectional view but not under luminescent conditions whereas for certain {113} embodiments the non-parallel dislocation array is visible under luminescent conditions but not in an X-ray topographic cross-sectional view. This is because dislocations in certain line directions emit blue luminescent light while in other line directions they do not. For {113} embodiments the crystallographic line direction of the dislocations in the non-parallel dislocation array is such that they emit blue luminescent light whereas for {110} embodiments the crystallographic line direction of the dislocations in the non-parallel dislocation array is such that they do not emit blue luminescent light.

Some examples of single crystal CVD synthetic diamond layers formed in accordance with the methods discussed herein are shown in FIGS. 5 to 8 and described below.

EXAMPLE 1

A synthetic type 1b HPHT diamond plate with a pair of approximately parallel major faces within approximately 5° of a (001) orientation was selected. The plate was fabricated into a square substrate suitable for homoepitaxial synthesis of single crystal CVD synthetic diamond material by a process including the following steps:

i) laser cutting of the substrate to produce a plate with all <100> edges; and ii) lapping and polishing the major surface upon which growth is to occur, the lapped and polished part having dimensions approximately 6.0 mm×6.0 mm by 400 μm thick, with all faces {100}.

A defect level at or below the substrate surface was minimised by careful preparation of the substrate as disclosed in EP 1 292 726 and EP 1 290 251. It is possible to reveal the defect levels being introduced by this processing by using a revealing plasma etch. It is possible routinely to produce substrates in which the density of defects measurable after a revealing etch is dependent primarily on the material quality and is below $5 \times 10^3$ $mm^{-2}$, and usually below $10^2$ $mm^{-2}$. The surface roughness at this stage was less than 10 nm over a measured area of at least 50 μm×50 μm. The substrate was mounted onto a substrate carrier. The substrate and its carrier were then introduced into a CVD reactor chamber and an etch and growth cycle commenced by feeding gasses into the chamber as follows:

First, an in situ oxygen plasma etch was performed using 16/20/600 sccm (standard cubic centimetre per second) of $O_2/Ar/H_2$ at a pressure of 230 Torr, a microwave frequency of 2.45 GHz, and a substrate temperature of 780° C., followed by a hydrogen etch, oxygen being removed from the gas flow at this stage. Then the first stage growth process was started by the addition of methane at 22 sccm. Nitrogen was added to achieve a level of 800 ppb in the gas phase. Hydrogen was also present in the process gas. The substrate temperature at this stage was 827° C. Over the subsequent 24 hours the methane content was increased to 32 sccm. These growth conditions were selected to give an a parameter value in the range of 2.0±0.2, based on previous test runs and confirmed retrospectively by crystallographic examination. On completion of the growth period, the substrate was removed from the reactor and the CVD synthetic diamond layer removed from the substrate by laser sawing and mechanical polishing techniques.

Study of the grown CVD synthetic diamond plate revealed that it was free of twins and cracks on the (001) face, and bounded by <110> sides and post-synthesis dimensions of the twin free top (001) face were increased to 8.7 mm×8.7 mm.

This block was then subsequently processed, using the same techniques described previously (cutting, lapping, polishing and etching) for the production of the Ib HPHT plate, to produce a plate with a major face (110) and a well-prepared surface with dimensions 3.8×3.2 mm and 200 μm thick. This was then mounted and grown on using identical conditions to that described above with the exception that during the synthesis stage, the substrate temperature was 800° C. and nitrogen was not introduced as a dopant gas.

This produced a CVD sample with a (110) major face and the CVD block had typical dimensions of 5.0×4.1 mm and 1.6 mm thickness.

Figure 5:
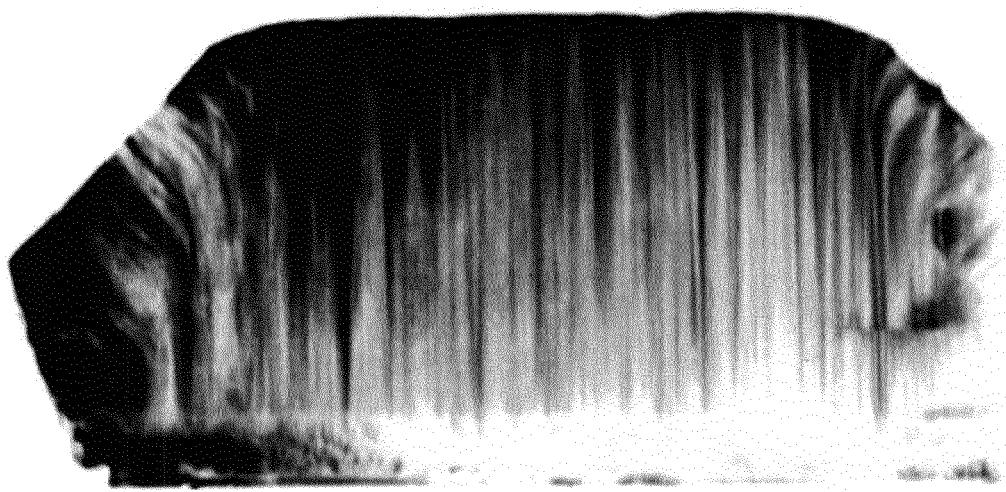
FIG. 5 illustrates a single crystal CVD synthetic diamond layer comprising a parallel array of dislocations.

In order to study the dislocation structure for this example an X-ray section topograph using a Bragg {533} reflection was recorded (corresponding to a (100) cross section). The X-ray topograph is shown in FIG. 5. FIG. 5 illustrates a single crystal CVD synthetic diamond layer grown upon a vertically-sliced (110) CVD synthetic substrate according to an embodiment of the present invention comprising a parallel array of dislocations. In this cross-section the dislocations form a parallel arrangement that follows the growth direction, i.e. the [110] direction. Such a configuration may correspond to Step D or Step E as illustrated in FIG. 2.

For the sample illustrated in FIG. 5, the <110>:<001> growth rate ratio was 1.1 and therefore falls within the "high" range where the growth is more likely to be dominated by kinetic rather than thermodynamic factors. It is clear from the image that the dislocations in Example 1 form a parallel array. It can be seen that 85% of the dislocations imaged in the X-ray topograph are between 0° and 2° of the <110> growth direction.

EXAMPLE 2

A (110) substrate was produced in an identical fashion to that described in Example 1. The growth conditions for the second growth stage were identical to those for Example 1 with the exception that the substrate temperature was reduced by 70 degrees to approximately 730° C. This produced a CVD sample with dimensions of 5.7×3.5 mm and 1.4 mm thickness. The seemingly minor change to the substrate temperature reduced the growth rate ratio <110>:<001> from a high value to a low value (approximately 0.4).

Figure 6:
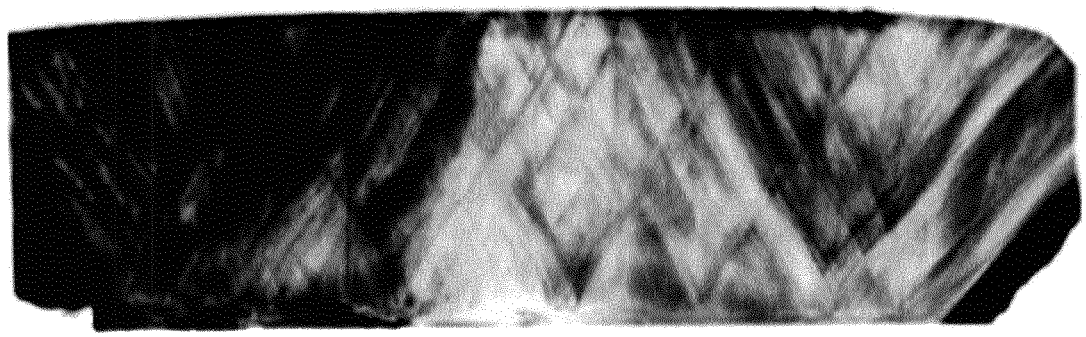
FIG. 6 illustrates a single crystal CVD synthetic diamond layer comprising a non-parallel array of dislocations.

In order to study the dislocation structure for this example an X-ray section topograph using a Bragg {533} reflection was recorded (corresponding to a (100) cross section). The X-ray topograph is shown in FIG. 6. FIG. 6 illustrates a single crystal CVD synthetic diamond layer grown upon a vertically-sliced (110) CVD synthetic substrate according to an embodiment of the present invention comprising a non-parallel array of dislocations. It can readily be seen that the dislocations form a non-parallel array and propagate in a direction close to the [100] direction. Such a configuration may correspond to Step F as illustrated in FIG. 2.

For the sample illustrated in FIG. 6, the <110>:<001> growth rate ratio was 0.4 and therefore falls within the "low" range where the growth is more likely to be dominated by thermodynamic rather than kinetic factors. It can be seen from FIG. 6 that the dislocations in Example 2 comprise a non-parallel array. The dislocations form an array of inter-crossing dislocations over the entire volume of the single crystal CVD synthetic diamond layer. The dislocations propagate in two directions, with the angle between the first and second direction being between 66° and 72°. 95% of the dislocations present within the entire volume of the sample are oriented between 9° and 12° of a <100> line direction. Furthermore, 95% of the dislocations present within the entire volume of the sample are 33° to 36° from the <110> growth direction. Analysis of twelve NV centres showed that they were all grown-in with preferential orientation in the <111> direction out-of-plane with respect to the (110) growth surface.

Figure 7:
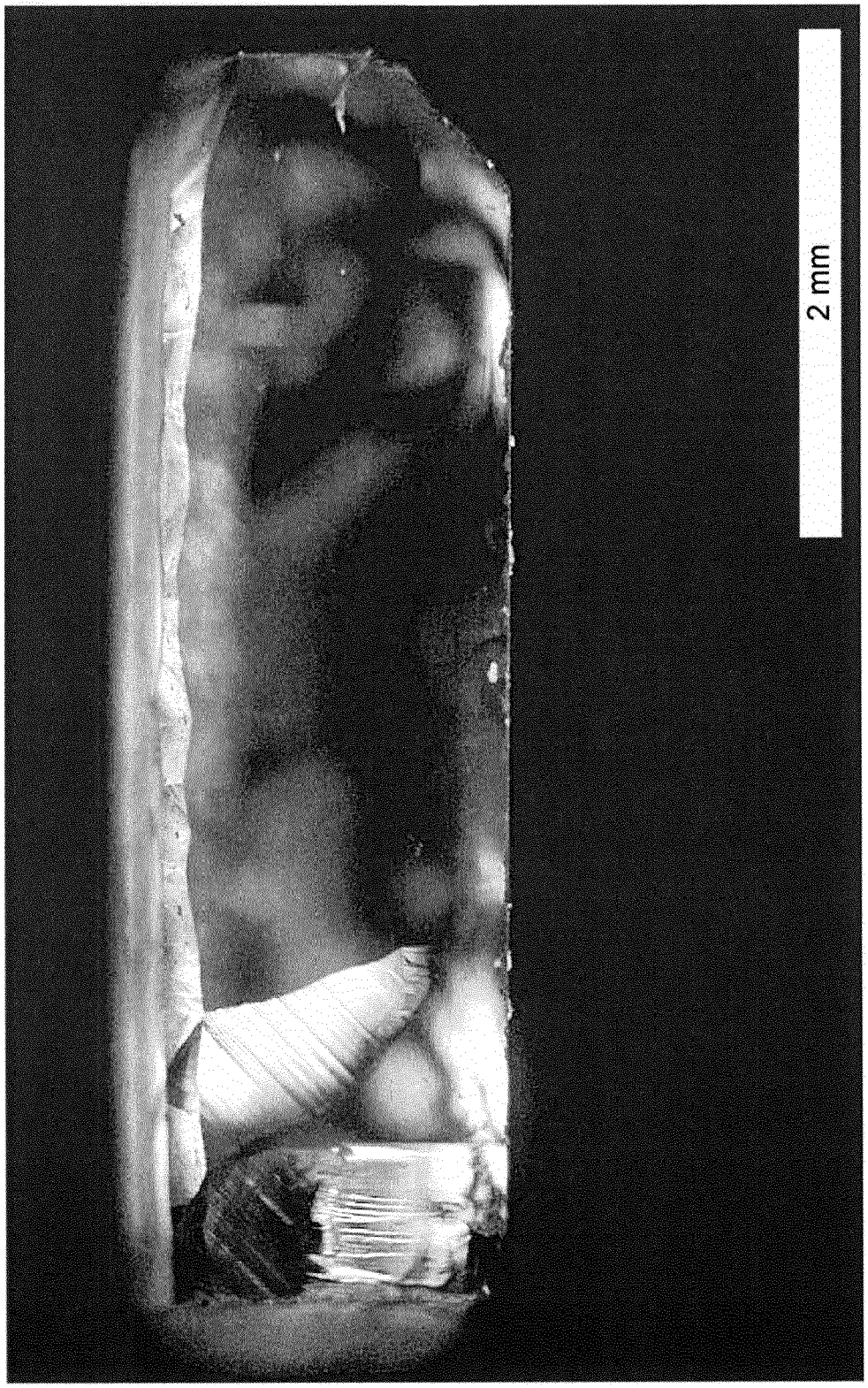
FIG. 7 illustrates a birefringence micrograph for the CVD synthetic diamond material of FIG. 6 which shows comparatively low strain considering the large dislocation density for this sample.

FIG. 7 illustrates a birefringence micrograph for the CVD synthetic diamond material of FIG. 6 which shows comparatively low strain considering the significant dislocation density for this sample.

Initial data also indicates that the CVD synthetic diamond material shown in FIGS. 6 and 7 has increased material hardness. An earlier review paper by Balmer et al. (J. Phys.: Condensed Matter 21 (2009) 364221) has already disclosed that tools made using a (110) orientation show lower wear and higher chip resistance than those made with a (001) plane. Initial data for the new material discussed herein indicates that the new material possesses the advantages of (110) diamond in terms of wear resistance, coupled with increased hardness (e.g. at least 100 GPa, more preferably at least 120 GPa).

EXAMPLE 3

A synthetic type Ib HPHT diamond was cut to form a plate with a pair of approximately parallel major faces within approximately 5° of a (113) orientation. The major surface upon which growth is to occur was further processed by lapping and polishing.

The substrate was mounted onto a substrate carrier. The substrate and its carrier were then introduced into a CVD reactor chamber. Etch and growth cycles were performed as described in Example 1 with the exception that the substrate temperature was reduced by 70 degrees to approximately 730° C. as described in Example 2.

The resultant single crystal CVD synthetic diamond material was found to comprise a non-parallel dislocation array visible under luminescent conditions (emitting blue luminescent light characteristic of dislocations of certain crystallographic line direction) but not in an X-ray topographic cross-sectional view.

Figure 8:
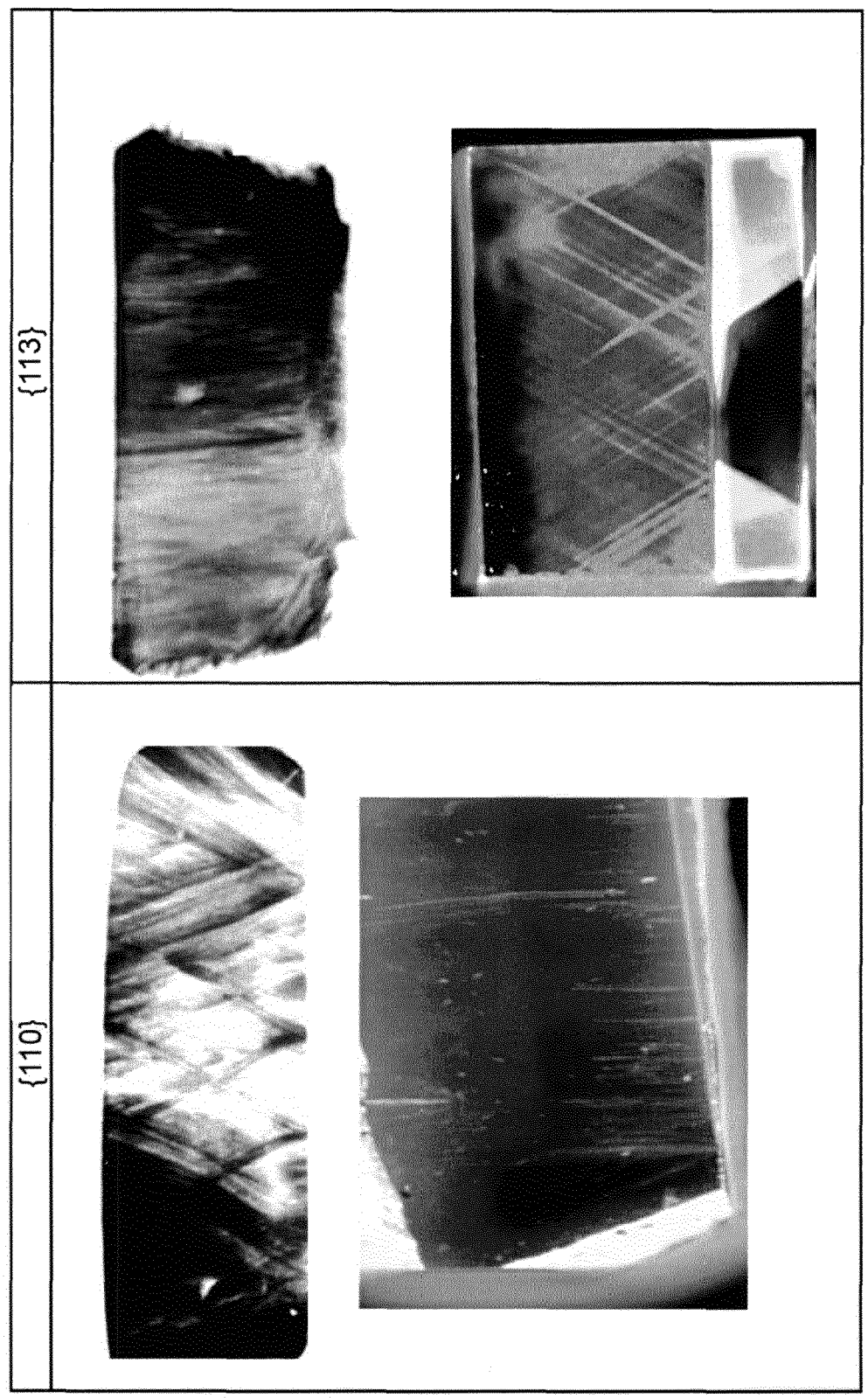
FIG. 8 illustrates single crystal CVD synthetic diamond layers grown on {110} and {113} oriented substrates in X-ray topographic cross-sectional view and under luminescent conditions.

FIG. 8 illustrates single crystal CVD synthetic diamond layers grown on {110} and {113} oriented substrates (as described in Examples 2 and 3) in X-ray topographic cross-sectional view (top) and under luminescent conditions (bottom). As can be seen in the Figure, for the {110} example the non-parallel dislocation array is visible in the X-ray topographic cross-sectional image but not in the luminescent image whereas for the {113} example the non-parallel dislocation array is visible in the luminescent image but not in an X-ray topographic cross-sectional image.

While this invention has been particularly shown and described with reference to preferred embodiments, it will be understood to those skilled in the art that various changes in form and detail may be made without departing from the scope of the invention as defined by the appendant claims.

The invention claimed is:

1. A single crystal CVD synthetic diamond layer comprising a non-parallel dislocation array, wherein the non-parallel dislocation array comprises a plurality of dislocations forming an array of inter-crossing dislocations, as viewed in an X-ray topographic cross-sectional view or under luminescent conditions, wherein the layer of single crystal CVD synthetic diamond has a thickness equal to or greater than 1 μm, wherein the non-parallel dislocation array extends over a volume forming at least 30% of a total volume of the single crystal CVD synthetic diamond layer, and wherein a direction in which a dislocation propagates is measured in terms of an average direction over at least 70% of a total length of the dislocation, wherein the non-parallel dislocation array comprises a first set of dislocations propagating in a first direction through the single crystal CVD synthetic diamond layer and a second set of dislocations propagating in a second direction through the single crystal CVD synthetic diamond layer, and wherein an angle between the first and second directions lies in the range of 40° to 100° as viewed in an X-ray topographic cross-sectional view or under luminescent conditions.

2. A single crystal CVD synthetic diamond layer according to claim 1, wherein the layer of single crystal CVD synthetic diamond has a thickness equal to or greater than 100 μm.

3. A single crystal CVD synthetic diamond layer according to claim 1, comprising a density of dislocations in a range $1 \times 10^2$ cm$^{-2}$ to $1 \times 10^8$ cm$^{-2}$.

4. A single crystal CVD synthetic diamond layer according to claim 1, comprising a birefringence equal to or less than $5 \times 10^{-4}$.

5. A single crystal CVD synthetic diamond layer according to claim 1, wherein the single crystal CVD synthetic diamond layer is a {110} or {113} oriented layer.

6. A single crystal CVD synthetic diamond layer according to claim 1, wherein the non-parallel dislocation array extends over a volume forming at least 60% of a total volume of the single crystal CVD synthetic diamond layer.

7. A single crystal CVD synthetic diamond layer according to claim 1, wherein the angle between the first and second directions lies in the range 60° to 90° as viewed in the X-ray topographic cross-sectional view or under luminescent conditions.

8. A single crystal CVD synthetic diamond layer according to claim 1, wherein a direction in which a dislocation propagates is measured in terms of an average direction over at least 80% of the total length of the dislocation and/or at least 1500 μm.

9. A single crystal CVD synthetic diamond layer according to claim 1, wherein at least 30% of a total number of visible dislocations within a volume of the single crystal CVD synthetic diamond layer form the non-parallel dislocation array as viewed in an X-ray topographic cross-sectional view or under luminescent conditions, said volume forming at least 30% of a total volume of the single crystal CVD synthetic diamond layer.

10. A single crystal CVD synthetic diamond layer according to claim 1, wherein the non-parallel dislocation array as viewable in an X-ray topographic cross-sectional view but not under luminescent conditions or alternatively the non-parallel dislocation array as viewable under luminescent conditions but not in an X-ray topographic cross-sectional view.

11. A single crystal CVD synthetic diamond material layer according to claim 1, comprising a hardness of at least 100 GPa.

12. A single crystal CVD synthetic diamond object comprising a single crystal diamond layer according to claim 1, wherein the single crystal diamond layer forms at least 30% of a total volume of the single crystal CVD synthetic diamond object.

13. A single crystal CVD synthetic diamond object according to claim 12, wherein the single crystal CVD synthetic diamond object is cut into a gemstone configuration.

* * * * *